United States Patent
Mifuji et al.

(10) Patent No.: US 8,384,150 B2
(45) Date of Patent: Feb. 26, 2013

(54) VERTICAL DOUBLE DIFFUSED MOS TRANSISTOR WITH A TRENCH GATE STRUCTURE

(75) Inventors: Michihiko Mifuji, Kyoto (JP); Ryuta Maruyama, Kyoto (JP); Masaki Hino, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 738 days.

(21) Appl. No.: 11/604,889

(22) Filed: Nov. 28, 2006

(65) Prior Publication Data

US 2007/0164353 A1 Jul. 19, 2007

(30) Foreign Application Priority Data

Nov. 29, 2005 (JP) ................................. 2005-344201
Nov. 29, 2005 (JP) ................................. 2005-344202

(51) Int. Cl.
*H01L 29/66* (2006.01)
(52) U.S. Cl. ........ 257/328; 257/332; 257/329; 257/135; 257/330; 257/E27.054; 257/334
(58) Field of Classification Search .................. 257/330, 257/334, 328, 332, 329, 135, E27.051
See application file for complete search history.

(56) References Cited

U.S. PATENT DOCUMENTS

| | | | | |
|---|---|---|---|---|
| 5,122,846 A | * | 6/1992 | Haken | 257/66 |
| 6,004,878 A | * | 12/1999 | Thomas et al. | 438/655 |
| 6,844,578 B2 | * | 1/2005 | Harada et al. | 257/278 |
| 2001/0008291 A1 | | 7/2001 | Aoki et al. | |
| 2002/0140026 A1 | | 10/2002 | Ishikawa et al. | |
| 2002/0167046 A1 | | 11/2002 | Aoki et al. | |
| 2003/0020102 A1 | * | 1/2003 | Gajda | 257/244 |
| 2004/0251516 A1 | | 12/2004 | Aida et al. | |
| 2004/0262677 A1 | | 12/2004 | Harada | |
| 2005/0090060 A1 | | 4/2005 | Aoki et al. | |
| 2006/0049459 A1 | | 3/2006 | Aida et al. | |
| 2009/0075433 A1 | | 3/2009 | Aida et al. | |

FOREIGN PATENT DOCUMENTS

| | | |
|---|---|---|
| JP | 06-053514 A | 2/1994 |
| JP | 09-129868 A | 5/1997 |
| JP | 2000-183337 A | 6/2000 |
| JP | 2000-269499 A | 9/2000 |
| JP | 2001-077362 A | 3/2001 |
| JP | 2001-196587 A | 7/2001 |
| JP | 2002-299621 A | 10/2002 |
| JP | 2002-313945 A | 10/2002 |
| JP | 2003-124466 A | 4/2003 |
| JP | 2004-179277 A | 6/2004 |
| JP | 2005-005438 A | 1/2005 |
| JP | 2005-019558 | 1/2005 |

* cited by examiner

*Primary Examiner* — Marc Armand
*Assistant Examiner* — Eva Yan Montalvo
(74) *Attorney, Agent, or Firm* — Rabin & Berdo, P.C.

(57) ABSTRACT

A semiconductor device of the present invention includes vertical double diffused MOS transistor. A gate electrode of the vertical double diffused MOS transistor is disposed within a trench formed on a semiconductor substrate and projects from a surface of the semiconductor substrate. On a side surface of the gate electrode, a side wall is formed. On the surface of the semiconductor substrate and a surface of the gate electrode, a metal silicide film is formed.

9 Claims, 27 Drawing Sheets

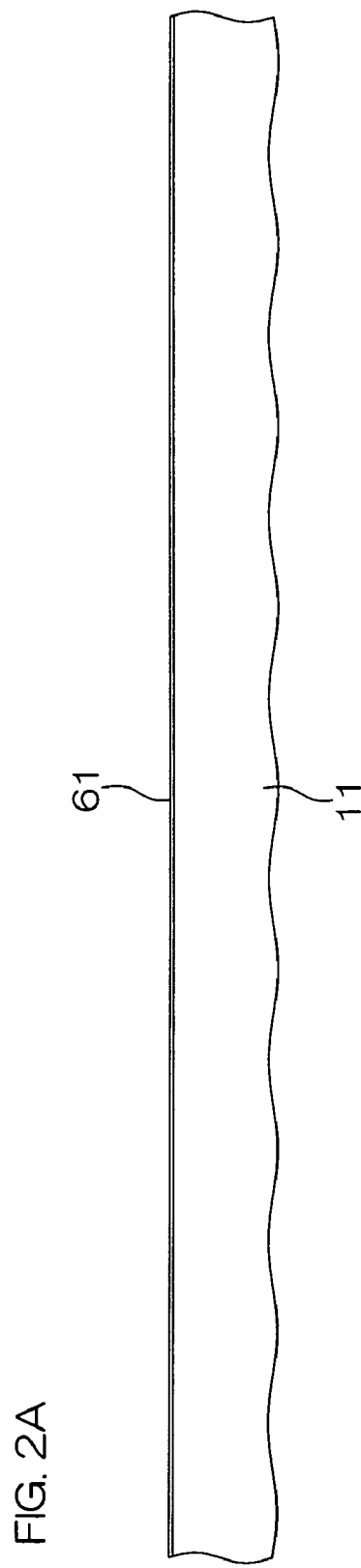

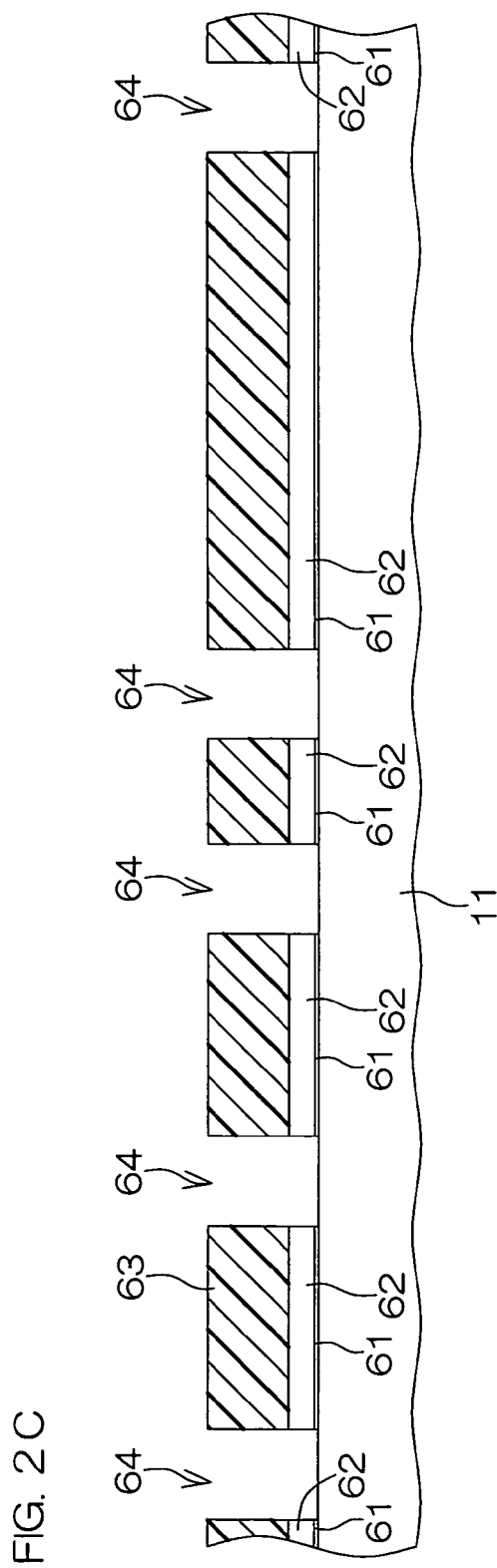

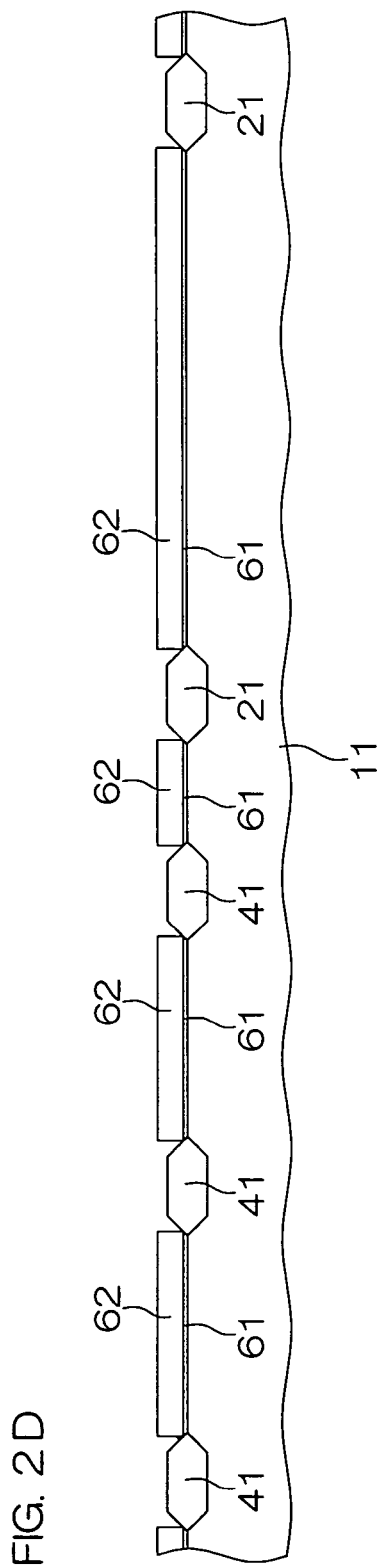

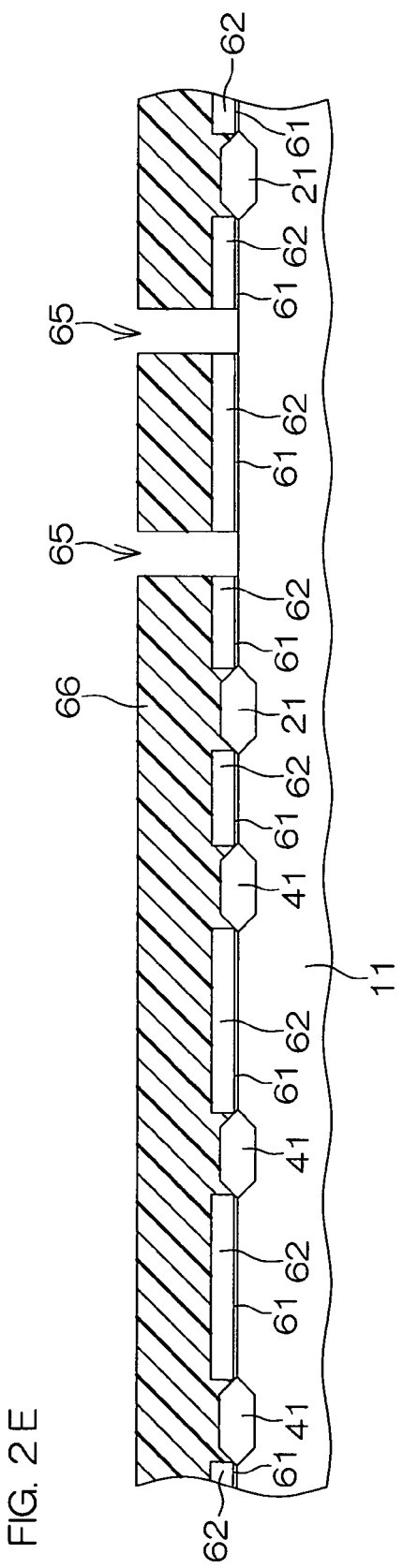

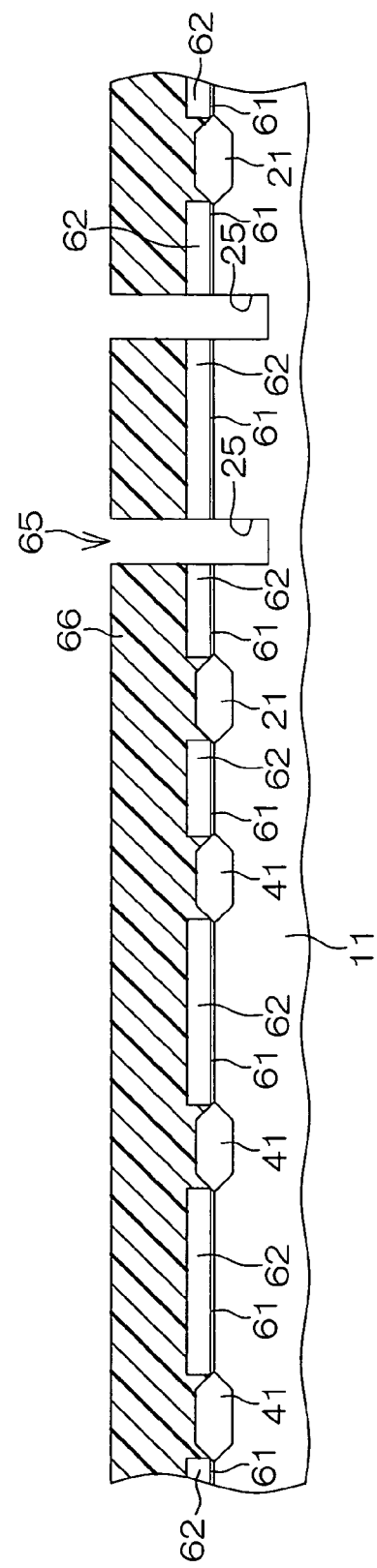

VERTICAL DOUBLE DIFFUSED MOS TRANSISTOR WITH A TRENCH GATE STRUCTURE

BACKGROUND OF THE INVENTION

1. Field of the Invention

The present invention relates to a semiconductor device having a vertical double diffused MOS transistor with a trench gate structure and a method for manufacturing the same.

2. Description of Related Art

For example, as a structure for increasing fineness and lowering on-resistance of a power device, a trench gate structure is known. In the field of power MOSFETs, employment of the trench gate structure has become mainstream.

FIG. 5 is a perspective view illustrating vertical double diffused MOSFET (VDMOSFET).

On an $N^+$-type substrate 101, an $N^-$-type layer 102 is laminated. On this $N^-$-type layer 102, a $P^-$-type layer 103 is laminated. On the $P^-$-type layer 103, an $N^+$-type region 104 and a $P^+$-type region 105 are formed.

In the $N^+$-type region 104, a plurality of trenches 106 are formed like stripes extending toward the $P^+$-type region 105 substantially parallel to each other. Each trench 106 penetrates the $N^+$-type region 104 and the $P^-$-type layer 103 under the $N^+$-type region 104. The deepest portion of each trench 106 reaches the $N^-$-type layer 102. In each trench 106, via a gate insulating film 107, a gate electrode 108 made of polysilicon doped with an N-type impurity at a high concentration is embedded.

The surface of the gate electrode 108 is formed lower than the surface of the $N^+$-type region 104. On the gate electrode 108, a tungsten silicide film 109 is formed. The tungsten silicide film 109 fills the inside of the trench 106 and its surface is flush with the surface of the $N^+$-type region 104. Thereby, a polycide structure is formed and lowering in resistance of gate electrode wiring formed by the gate electrode 108 and the tungsten silicide film 109 is realized.

On the $N^+$-type region 104 and the $P^+$-type region 105, an interlayer insulation film is formed although this is not shown. On this interlayer insulation film, a source electrode is formed so as to be contacted by (electrically connected to) the $N^+$-type region 104 and the $P^+$-type region 105 via a contact hole formed in the interlayer insulation film.

On the other hand, on the back surface of the $N^+$-type substrate 101 (surface on the side opposite to the side where the $N^-$-type layer 102 is formed), a drain electrode 110 is formed. By controlling the potential of the gate electrode wiring while applying an appropriate voltage between the drain electrode 110 and the source electrode, a channel is formed in the vicinity of the interface with the gate insulating film 107 in the $P^-$-type layer 103 and a current can be supplied between the drain electrode 110 and the source electrode.

On the gate electrode 108, the tungsten silicide film 109 is formed to lower the resistance of the gate electrode wiring including the gate electrode 108 and the tungsten silicide film 109, whereby an increase in parasitic resistance according to an increase in fineness of the gate electrode wiring can be suppressed.

The tungsten silicide film 109 can be selectively formed on the gate electrode 108 by using processes of both W-CVD and W etch back (or W-CMP). However, if the tungsten silicide film 109 is formed to be thicker than the $N^+$-type region 104 (if the bottom surface of the tungsten silicide film 109 becomes lower than the bottom surface of the $N^+$-type region 104), the threshold voltage of the VDMOSFET deviates from a designed value. Therefore, the tungsten silicide film 109 must be formed to be thinner than the $N^+$-type region 104, and process control for realizing this is difficult.

SUMMARY OF THE INVENTION

An object of the present invention is to provide a semiconductor device and a method for manufacturing the same capable of simplifying the manufacturing process.

A semiconductor device according to an aspect of the present invention including a vertical double diffused MOS transistor with a trench gate structure includes a semiconductor substrate, a trench formed on this semiconductor substrate, a gate electrode which is disposed within the trench and project from a surface of the semiconductor substrate, a side wall formed on a side surface of the gate electrode (at portion projecting from the surface of the semiconductor substrate), and metal silicide films formed on the surface of the semiconductor substrate and a surface of the gate electrode.

The semiconductor device thus structured can be obtained by a method for manufacturing a semiconductor device, including the steps of: forming a trench on a semiconductor substrate; forming a gate electrode which is disposed within the trench and project from the surface of the semiconductor substrate; forming a side wall on a side surface of the gate electrode; and after forming the sidewall, forming metal silicide films on the surface of the semiconductor substrate and the surfaces of the gate electrode.

The metal silicide film is formed on the gate electrode that the gate electrode wiring formed by the gate electrode and the metal silicide film can be lowered in resistance. By lowering the resistance of the gate electrode wiring, an increase in parasitic resistance according to an increase in fineness of the gate electrode wiring can be suppressed.

The metal silicide film is formed on the semiconductor substrate, so that, for example, in a construction in which a plurality of gate electrode are formed in stripes, by providing a contact with a source electrode in a region which is adjacent to and electrically conducted via the metal silicide film to the source electrode between the gate electrode (region in which no gate electrode is formed, that is, the $P^+$-type region in the embodiment described later), electrical connection between the source electrode and the source region can be realized without providing a contact with the source electrode in the source region. As a result, the distance between the gate electrode (trenches) is shortened and the fineness of the vertical double diffused MOS transistors can be increased.

Furthermore, the sidewall is formed on the side surface (portion projecting to the outside of the trench) of the gate electrode, so that the metal silicide films on the gate electrode and the metal silicide film on the semiconductor substrate can be formed in a self-aligning manner. Therefore, when forming these metal silicide films, a lithography process, etc., can be made unnecessary. As a result, the manufacturing process for the semiconductor device having the vertical double diffused MOS transistor can be simplified.

A semiconductor device according to another aspect of the present invention including planar MOS transistor and vertical double diffused MOS transistor with a trench gate structure, includes a semiconductor substrate, a vertical double diffused MOS transistor gate electrode projecting from the surface of the semiconductor substrate, a planar MOS transistor gate electrode formed on the semiconductor substrate, a side wall formed on a side surface of the vertical double diffused MOS transistor gate electrode and the planar MOS transistor gate electrode, and metal silicide films formed on the surface of the semiconductor substrate and the surfaces of the vertical double diffused MOS transistor gate electrode and the planar MOS transistor gate electrode.

The semiconductor device thus structured can be obtained by a method for manufacturing a semiconductor device including the steps of: forming a trench on a semiconductor substrate; forming a vertical double diffused MOS transistor gate electrode which is disposed within the trench and project from the surface of the semiconductor substrate; forming a planar MOS transistor gate electrode on the semiconductor substrate; forming a side wall on a side surface of the vertical double diffused MOS transistor gate electrode and the planar MOS transistor gate electrode; and after forming the side wall, forming metal silicide films on the surface of the semiconductor substrate and the surfaces of the vertical double diffused MOS transistor gate electrode and the planar MOS transistor gate electrode.

The vertical double diffused MOS transistor brings about the same effect as described in relation to the semiconductor device according to the aspect of the present invention.

For forming the side wall on the side surface of the planar MOS transistor gate electrode, for example, a silicon nitride film is formed on the semiconductor substrate and removed by dry-etching, and the silicon nitride films also remain on the side surface of the vertical double diffused MOS transistor gate electrode. On the other hand, in the case of a construction including side wall on the side surface of the planar MOS transistor gate electrode, the step of removing the silicon nitride films remaining on the side surface of the vertical double diffused MOS transistor gate electrode can be omitted. Furthermore, in the case of a construction including the metal silicide film only on the vertical double diffused MOS transistor gate electrode, masking is required so as to prevent metal films from being formed on other portions. On the other hand, in the case of the construction including metal silicide films on the semiconductor substrate and the planar MOS transistor gate electrode, a metal film is formed on the entire surface of the semiconductor substrate and then portions of the metal film which have not reacted to silicon are removed. Therefore, the lithography process for masking, etc., can be made unnecessary. Therefore, the manufacturing process for a semiconductor device including a mixture of planar MOS transistors and vertical double diffused MOS transistors with a trench gate structure can be simplified.

A semiconductor device according to still another aspect of the present invention including a vertical double diffused MOS transistor with a trench gate structure includes a semiconductor substrate, a trench formed on this semiconductor substrate, a gate insulating film which is formed along an inner surface of the trench and have a protruding portion protruding to an outside of the trench, a gate electrode embedded in the trench, and metal silicide films formed on a surface of the semiconductor substrate and a surface of the gate electrode.

The semiconductor device thus structured can be obtained by a method for manufacturing a semiconductor device, including the steps of: forming a trench on a semiconductor substrate; forming a gate insulating film having protruding portion protruding to the outside of the trench, along an inner surface of the trench; forming gate electrode embedded in the trench; and forming metal silicide films on the surface of the semiconductor substrate and the surface of the gate electrode.

The metal silicide film is formed on the gate electrode, so that gate electrode wiring formed by the gate electrode and the metal silicide film can be lowered in resistance. By lowering the resistance of the gate electrode wiring, an increase in parasitic resistance according to an increase in fineness of the gate electrode wiring can be suppressed.

The metal silicide film is formed on the semiconductor substrate, so that, for example, in a construction in which a plurality of gate electrode are formed in stripes, by providing a contact with a source electrode in a region which is adjacent to and electrically conducted via the metal silicide film to the source electrode between the gate electrode (region in which no gate electrode is formed, that is, the $P^+$-type region in the embodiment described later), electrical connection between the source electrode and the source region can be realized without providing a contact with the source electrode in the source region. As a result, the distance between the gate electrode (trenches) is shortened and the fineness of the vertical double diffused MOS transistors can be increased.

Furthermore, the gate insulating film has the protruding portion (bird's beak) protruding to the outside of the trench, so that the metal silicide film on the gate electrode and the metal silicide film on the semiconductor substrate can be formed in a self-aligning manner. Therefore, when forming these metal silicide films, a lithography process, etc., can be made unnecessary. As a result, the manufacturing process for the semiconductor device including the vertical double diffused MOS transistor can be simplified.

The above-described or other objects, features, and effects will become more apparent from the following description of embodiments with reference to the accompanying drawings.

DETAILED DESCRIPTION OF PREFERRED EMBODIMENTS

Hereinafter, embodiments of the present invention will be described in detail with reference to the accompanying drawings.

Figure 1:
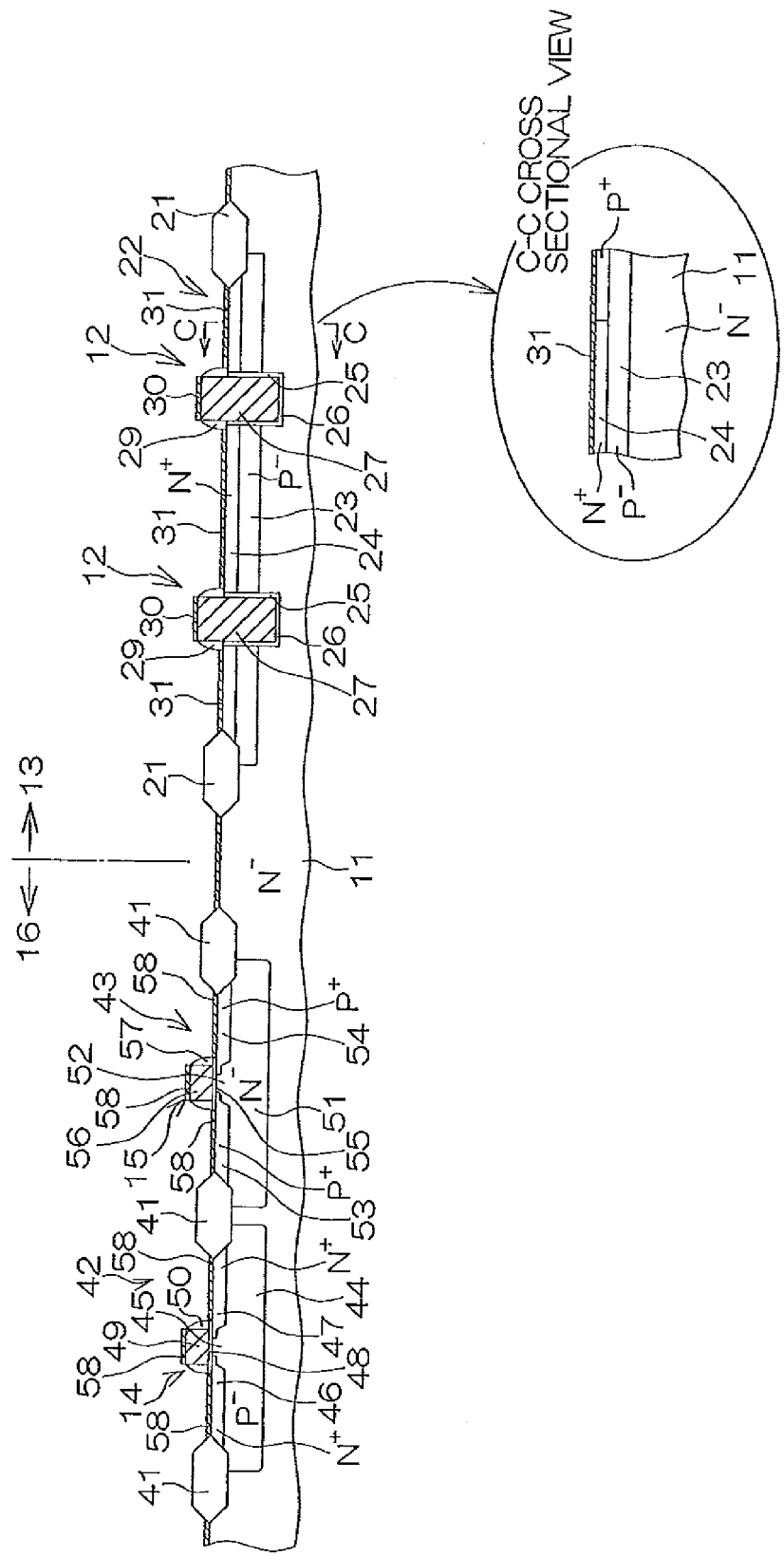
FIG. 1 is a schematic sectional view showing a structure of a semiconductor device according to a first embodiment of the present invention.

FIG. 1 is a schematic sectional view showing a structure of a semiconductor device according to an embodiment of the present invention. This semiconductor device has, on an $N^-$-type semiconductor substrate 11, a VDMOS forming region 13 in which a plurality of VDMOSFETs 12 are formed, and a CMOS forming region 16 in which a planar NMOSFET 14 and a PMOSFET 15 are formed.

The plurality of VDMOSFETs 12 are formed in an element forming region 22 separated by LOCOS oxide films 21 in the VDMOS forming region 13. In this element forming region 22, a $P^-$-type region 23 is formed in a surface layer portion of the semiconductor substrate 11. In a surface layer portion of the $P^-$-type region 23, an $N^+$-type region 24 and a $P^+$-type region 24a are formed. In the element forming region 22, a plurality of trenches 25 are formed. Each trench 25 penetrates the $N^+$-type region 24 and the $P^-$-type region 23, and the deepest portion of each trench 25 reaches the semiconductor substrate 11. In this embodiment, the plurality of trenches 25 are formed in stripes extending toward the $P^+$-type region 24a substantially parallel to each other.

Inside the trench 25, a gate electrode 27 made of polysilicon doped with an N-type impurity at a high concentration is provided via a gate insulating film (oxide film) 26. This gate electrode 27 fills the inside of the trench 25 and projects to the outside of the trench 25 (upward more than the surface of the $N^+$-type region 24).

On a side surface of the portion projecting to the outside of the trench 25 of the gate electrode 27, a side wall 29 made of silicon nitride is formed so as to surround the entire periphery thereof.

On the gate electrode 27, a metal silicide film 30 is formed. Thereby, the resistance of gate electrode wiring formed by the gate electrode 27 and the metal silicide film 30 is lowered. By lowering the resistance of the gate electrode wiring, an increase in parasitic resistance according to an increase in fineness of the gate electrode wiring can be suppressed.

On the $N^+$-type region 24 and the $P^+$-type region 24a, a metal silicide film 31 is formed. On the metal silicide film 31, a source electrode is formed via an interlayer insulation film although this is not shown. By forming the metal silicide film 31, the $N^+$-type region 24 and the $P^+$-type region 24a are electrically conducted to each other, and these can be kept at the same potential. By forming a contact hole in the interlayer insulation film of the $P^+$-type region 24a and connecting the source electrode to the $P^+$-type region 24a via the contact hole, electrical connection between the source electrode and the $N^+$-type region 24 can be made without providing, on the $N^+$-type region 24, a contact with the source electrode. As a result, the distance between the trenches 25 can be shortened and the fineness of the VDMOSFETs 12 can be further increased.

Furthermore, the side wall 29 is formed on the side surface of the portion projecting to the outside of the trench 25 of the gate electrode 27, so that the metal silicide film 30 on the gate electrode 27 and the metal silicide film 31 on the semiconductor substrate 11 can be formed in a self-aligning manner. Therefore, when forming the metal silicide films 30 and 31, the lithography process, etc., can be made unnecessary. As a result, the manufacturing process for the semiconductor device including the VDMOSFETs 12 can be simplified.

The NMOSFET 14 and PMOSFET 15 are respectively formed in element forming regions 42 and 43 separated by LOCOS oxide films 41 in the CMOS forming region 16.

In the element forming region 42 in which the NMOSFET 14 is formed, in the surface layer portion of the semiconductor substrate 11, a $P^-$-type well 44 is formed. In the surface layer portion of this $P^-$-type well 44, an $N^+$-type source region 46 and a drain region 47 are formed while sandwiching a channel region 45 therebetween. On the channel region 45, a gate insulating film (oxide film) 48 is formed. On the gate insulating film 48, a gate electrode 49 made of polysilicon controlled to be an $N^+$-type (doped with an N-type impurity) is formed. On a side surface of the gate electrode 49, a side wall 50 made of silicon nitride is formed so as to surround the periphery thereof.

In the element forming region 43 in which the PMOSFET 15 is formed, in the surface layer portion of the semiconductor substrate 11, an $N^-$-type well 51 is formed. In the surface layer portion of this $N^-$-type well 51, a $P^+$-type source region 53 and a drain region 54 are formed while sandwiching a channel region 52 therebetween. On the channel region 52, a gate insulating film (oxide film) 55 is formed. On this gate insulating film 55, a gate electrode 56 made of polysilicon controlled to be a $P^+$-type (doped with a P-type impurity) is formed. On the side surface of the gate electrode 56, a side wall 57 made of silicon nitride is formed so as to surround the periphery thereof.

On the gate electrode 49, the source region 46 and the drain region 47 of the NMOSFET 14 and the gate electrode 56, the source region 53 and the drain region 54 of the PMOSFET 15, metal silicide films 58 are formed. These metal silicide film 58 is formed simultaneously when the metal silicide films 30 and 31 of the VMOSFET 12 are formed.

Figure 2B:
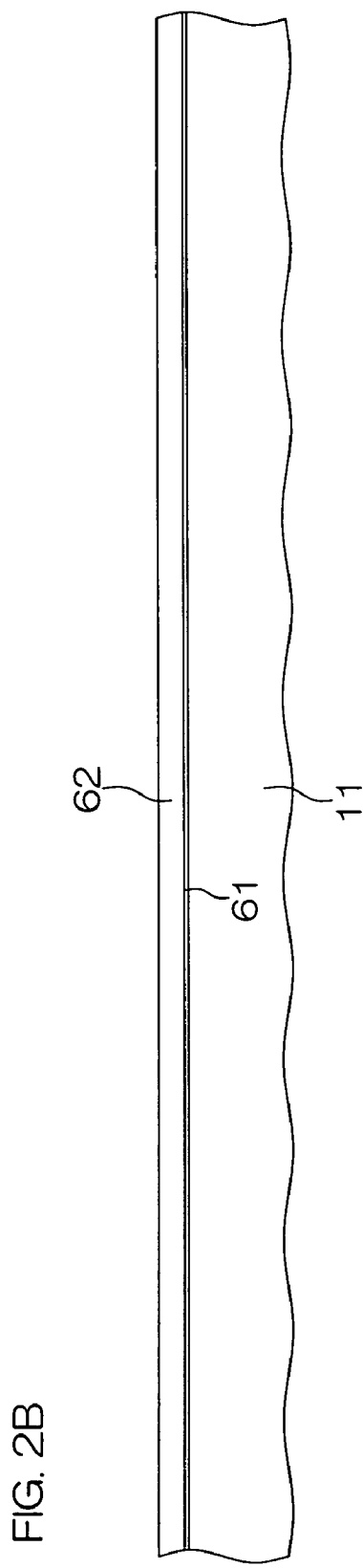
FIG. 2B is a schematic sectional view showing a next step from FIG. 2A.
Figure 2G:
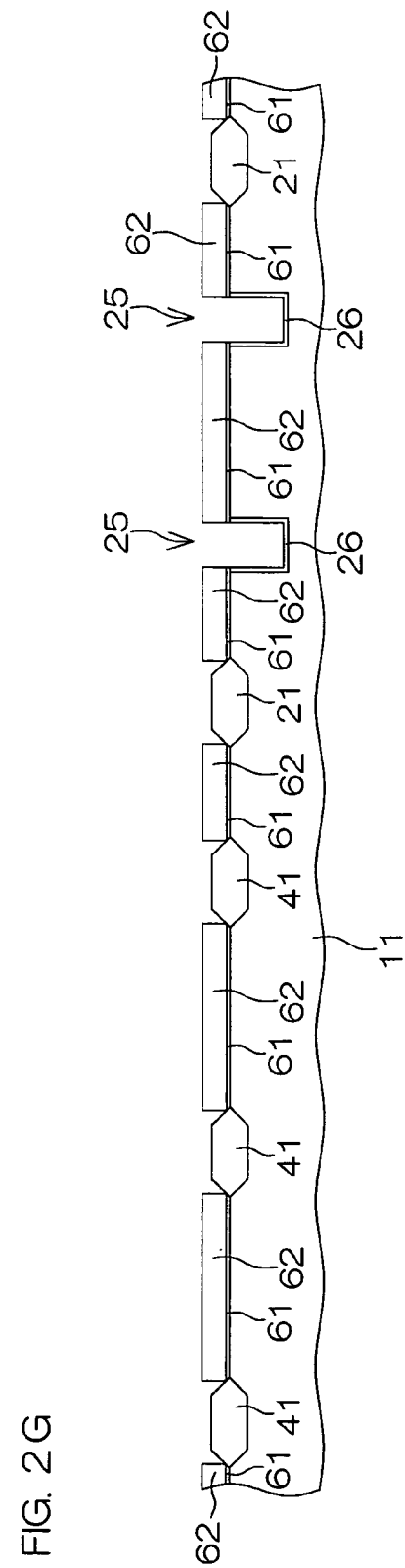
FIG. 2G is a schematic sectional view showing a next step from FIG. 2F.
Figure 2H:
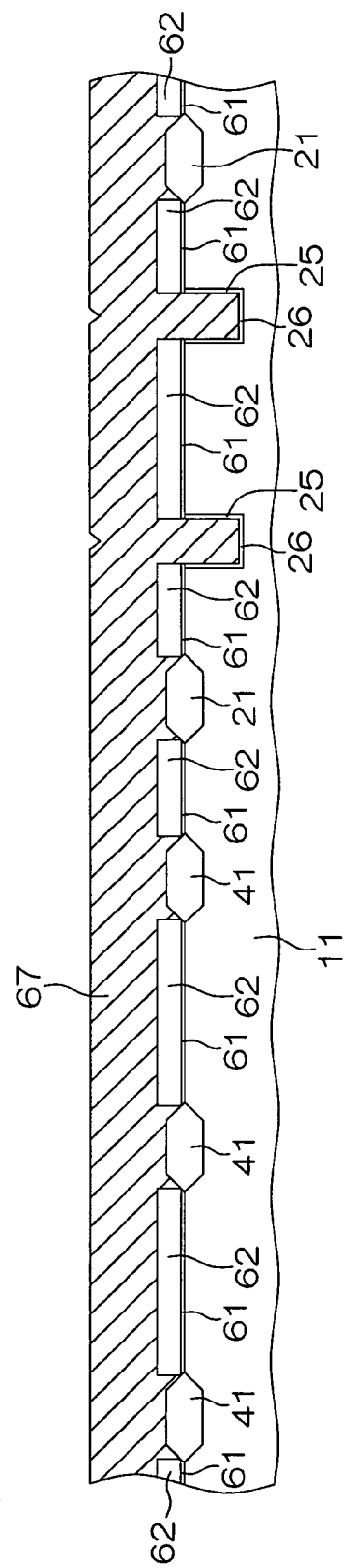
FIG. 2H is a schematic sectional view showing a next step from FIG. 2G.
Figure 21:
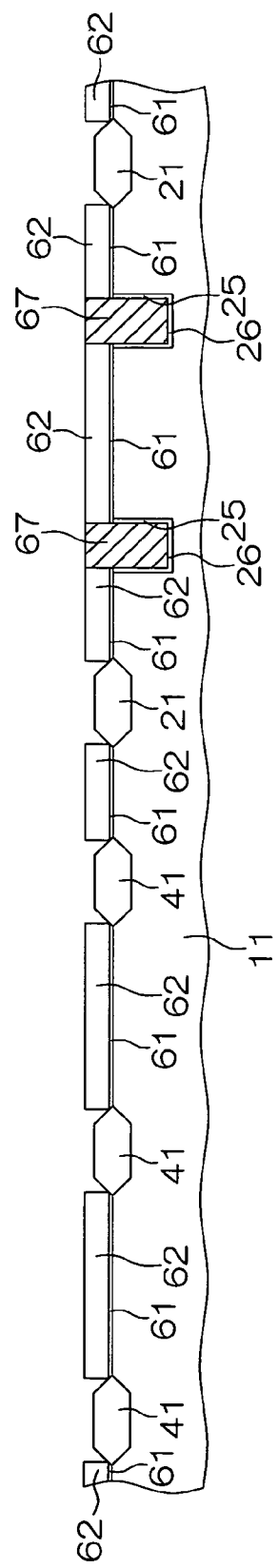
Figure 2:
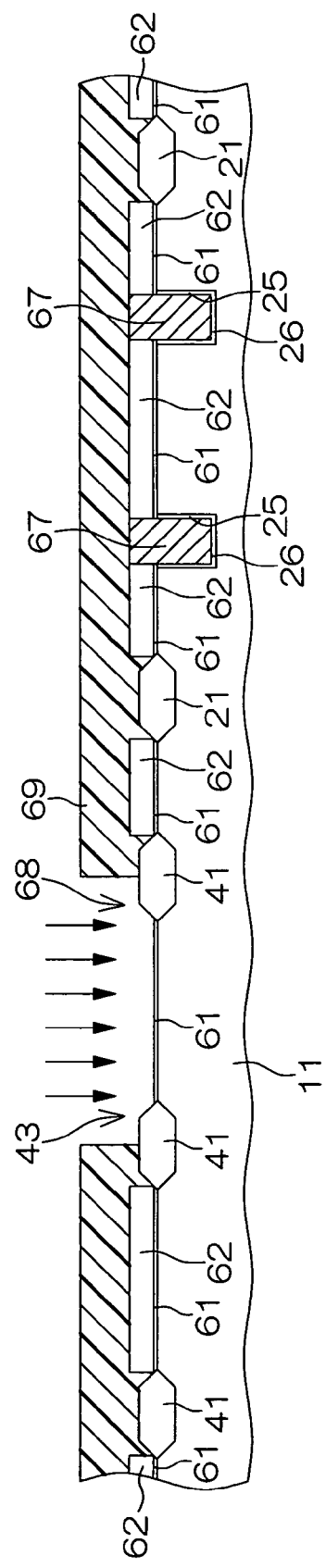
FIG. 2A is a schematic sectional view for describing a method for manufacturing the semiconductor device shown in FIG. 1.
FIG. 2C is a schematic sectional view showing a next step from FIG. 2B.
FIG. 2D is a schematic sectional view showing a next step from FIG. 2C.
FIG. 2E is a schematic sectional view showing a next step from FIG. 2D.
FIG. 2F is a schematic sectional view showing a next step from FIG. 2E.
FIG. 2I is a schematic sectional view showing a next step from FIG. 2H.
FIG. 2J is a schematic sectional view showing a next step from FIG. 2I.
FIG. 2K is a schematic sectional view showing a next step from FIG. 2J.
FIG. 2L is a schematic sectional view showing a next step from FIG. 2K.
FIG. 2M is a schematic sectional view showing a next step from FIG. 2L.
FIG. 2N is a schematic sectional view showing a next step from FIG. 2M.
FIG. 2O is a schematic sectional view showing a next step from FIG. 2N.
FIG. 2P is a schematic sectional view showing a next step from FIG. 2O.
FIG. 2Q is a schematic sectional view showing a next step from FIG. 2P.
FIG. 2R is a schematic sectional view showing a next step from FIG. 2Q.
FIG. 2S is a schematic sectional view showing a next step from FIG. 2R.
FIG. 2T is a schematic sectional view showing a next step from FIG. 2S.
FIG. 2U is a schematic sectional view showing a next step from FIG. 2T.
Figure 2K:
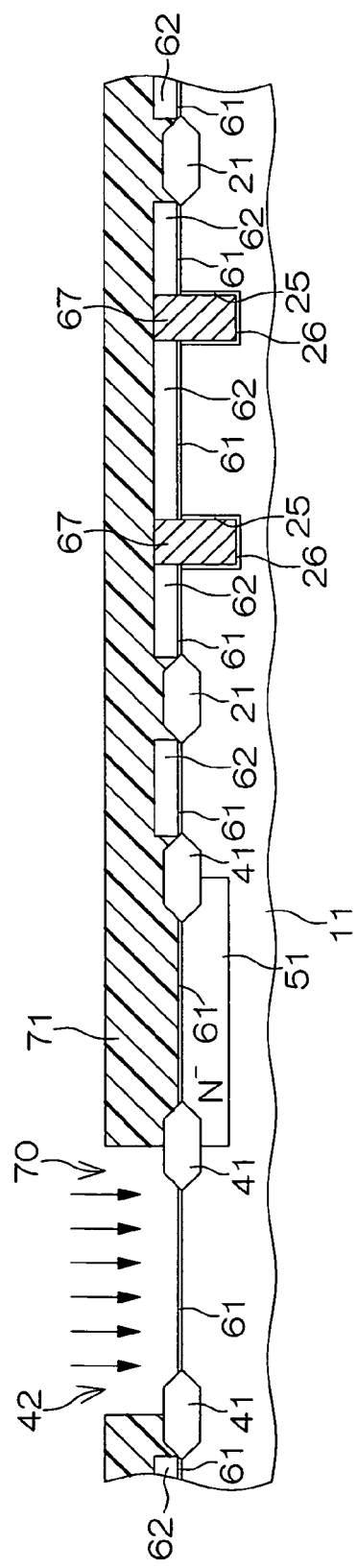
Figure 2L:
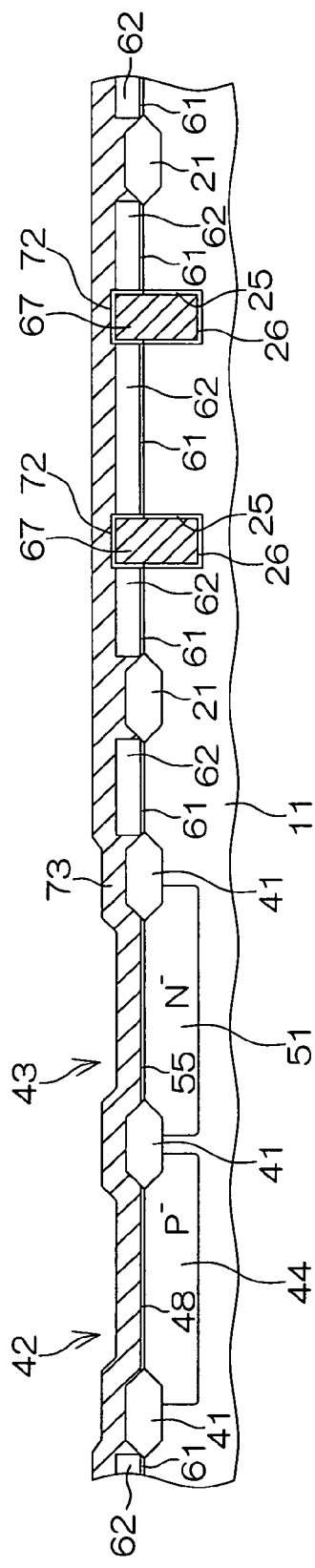
Figure 2M:
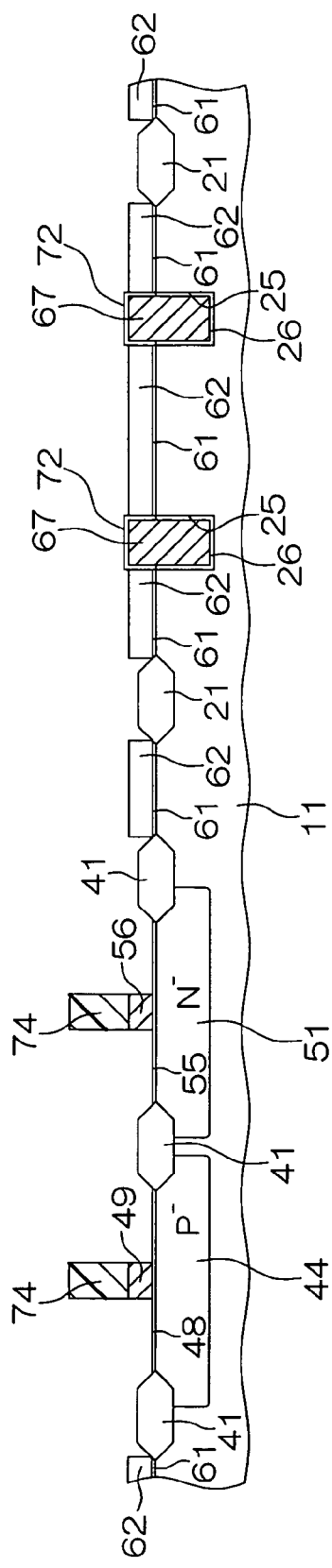
Figure 2N:
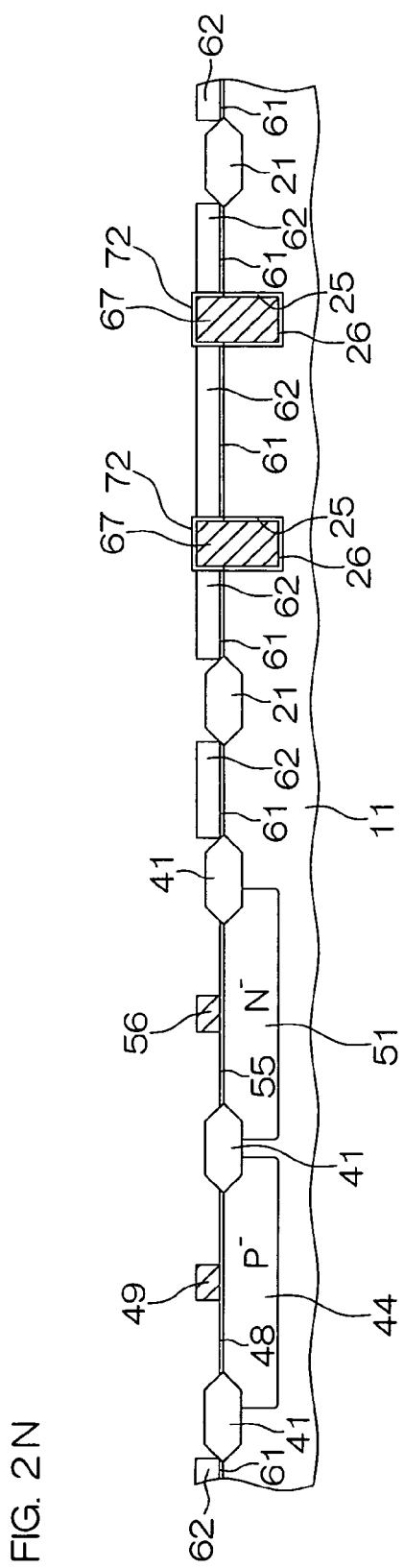
Figure 20:
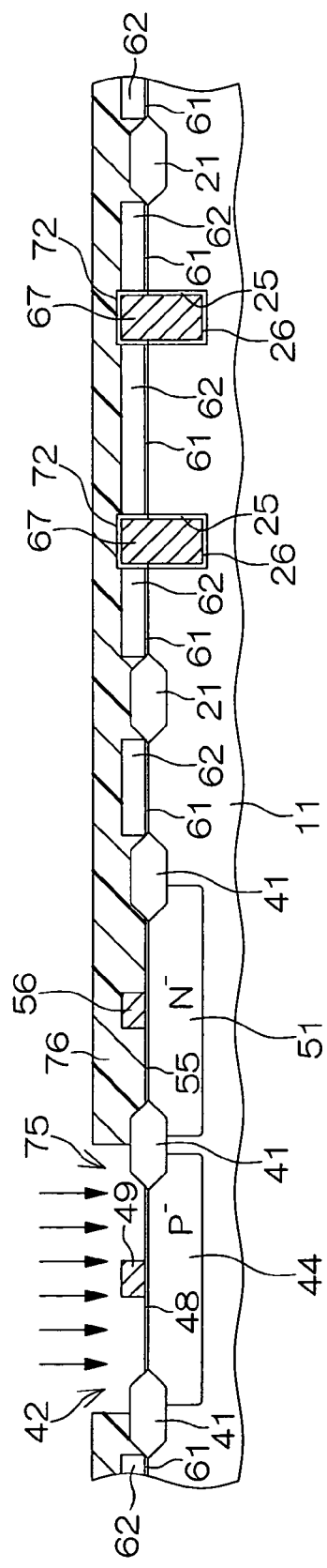
Figure 2P:
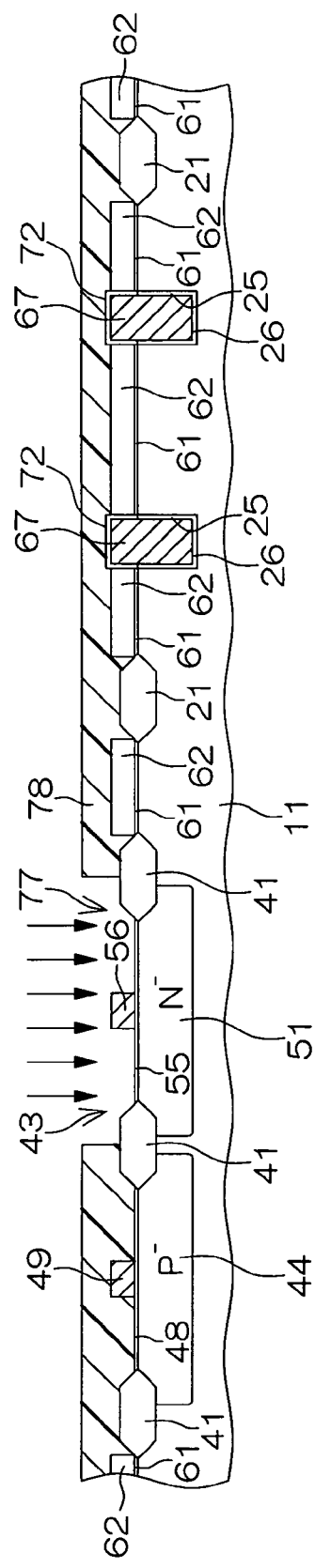
Figure 2Q:
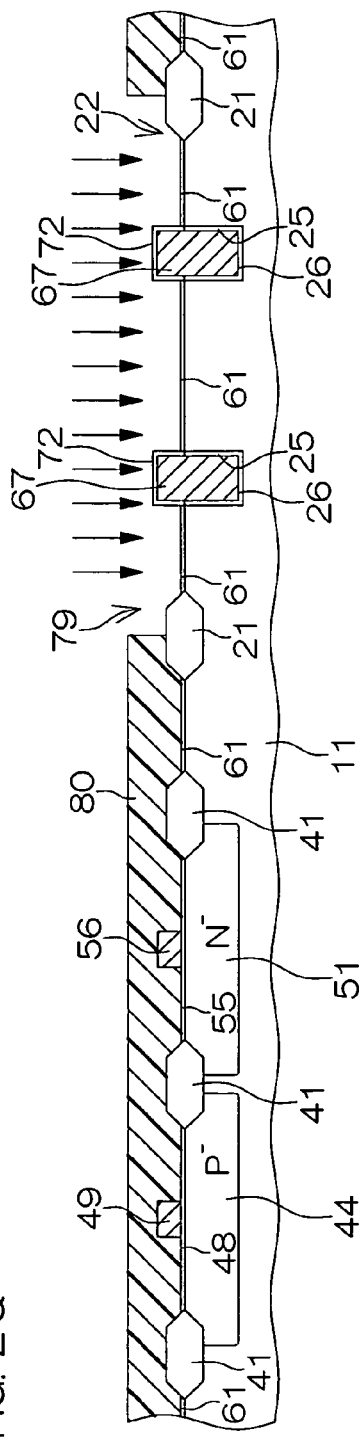
Figure 2R:
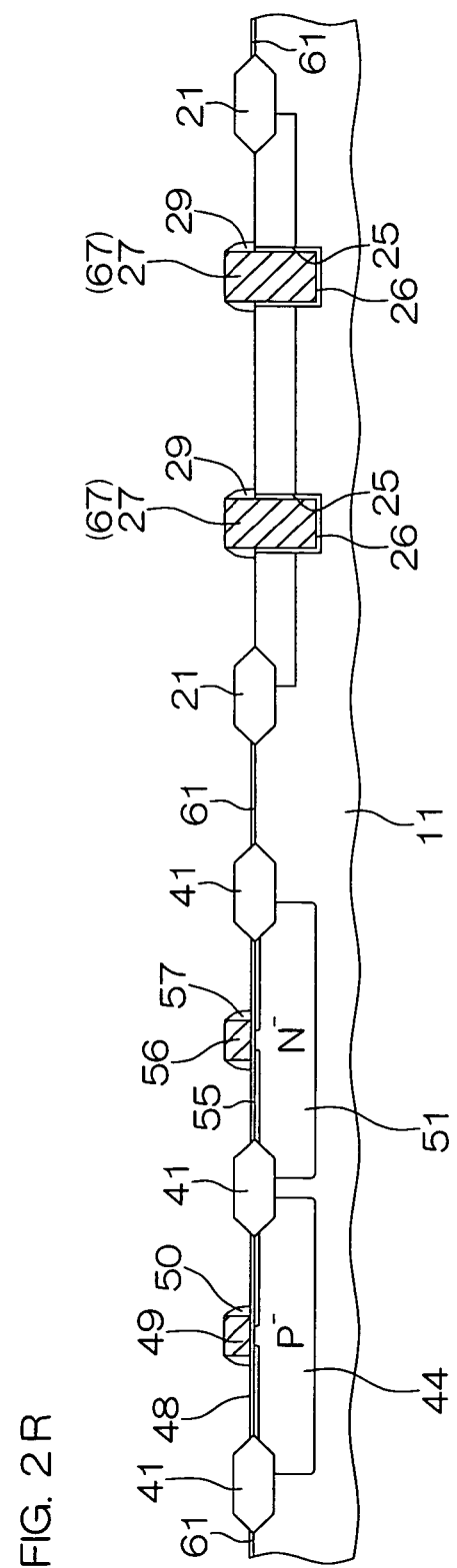
Figure 2S:
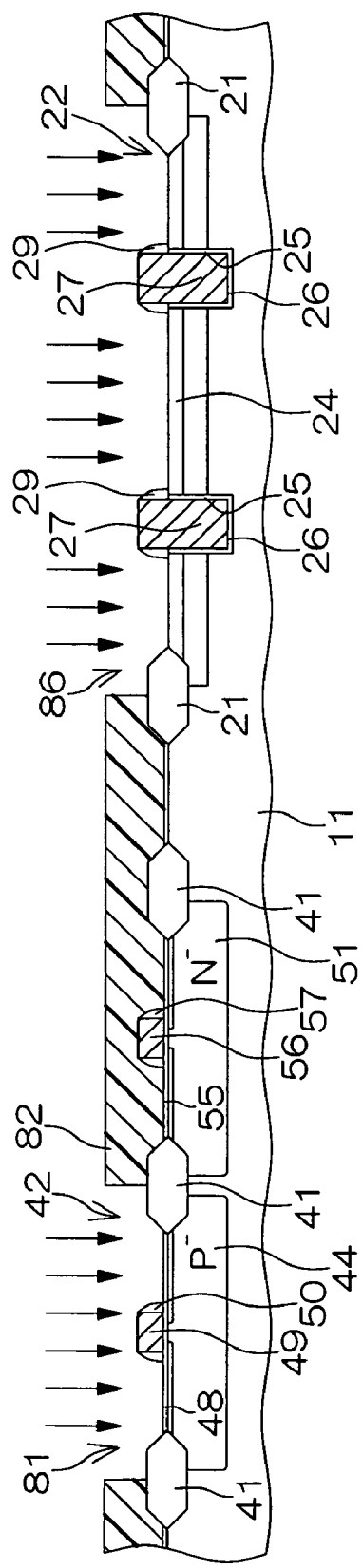
Figure 2T:
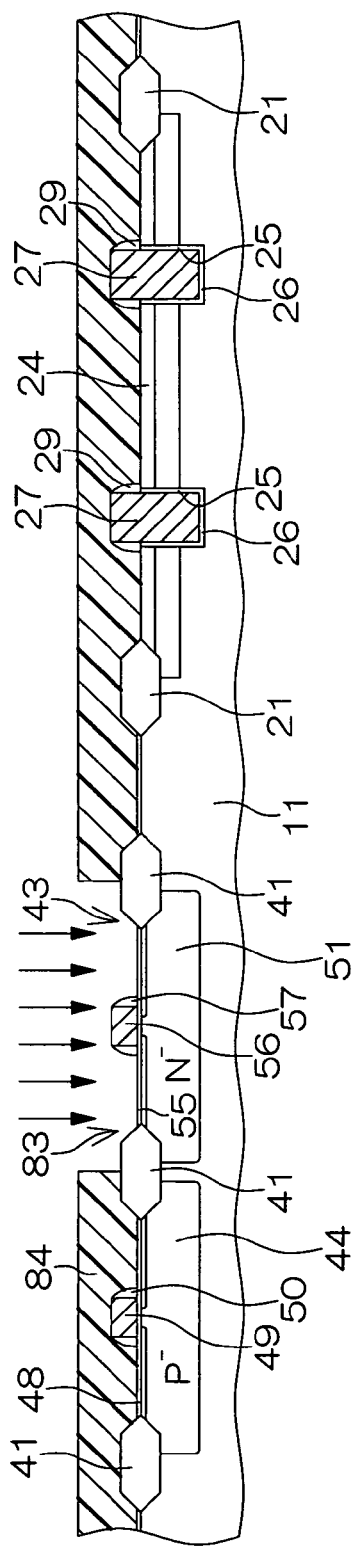
Figure 2U:
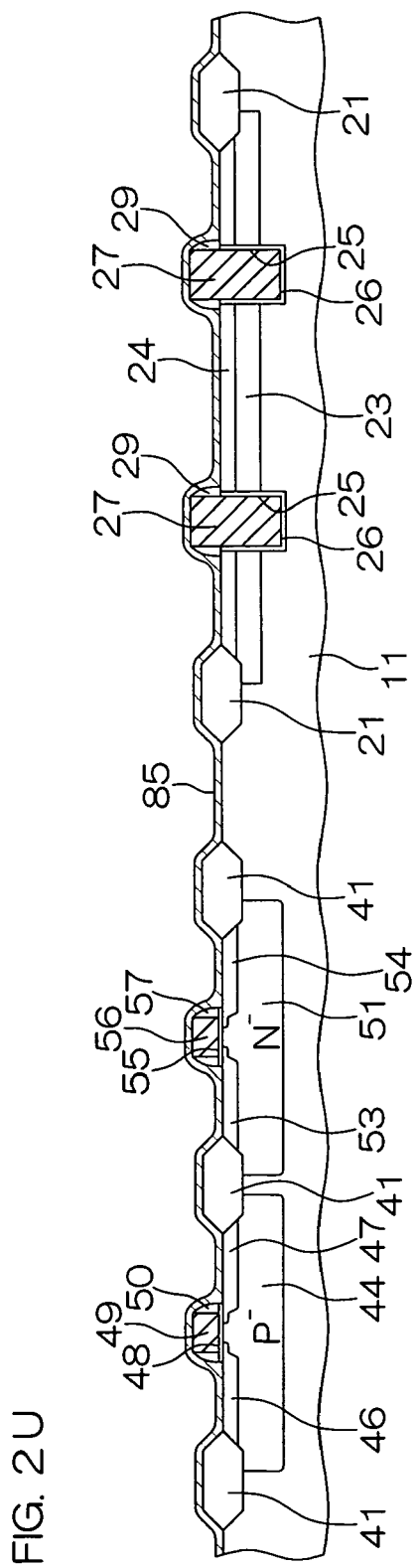

FIG. 2A through FIG. 2U are schematic sectional views showing a manufacturing method for the semiconductor device in order of steps.

First, as shown in FIG. 2A, a pad oxide film 61 is formed on the entire surface of the semiconductor substrate 11 by means of thermal oxidation.

Next, as shown in FIG. 2B, a silicon nitride film 62 covering the entire surface of the pad oxide film 61 is formed by a CVD (chemical vapor deposition) method.

Subsequently, as shown in FIG. 2C, on the surface of the silicon nitride film 62, a pattern of a resist film 63 is formed. This resist film 63 has openings 64 corresponding to the LOCOS oxide films 21 and 41 and covers the remaining portions. Thereafter, by performing dry etching by using the resist film 63 as a mask, the pad oxide film 61 and the silicon nitride film 62 are patterned. After this patterning, the resist film 63 is removed.

Next, as shown in FIG. 2D, LOCOS oxide films 21 and 41 are formed by a LOCOS method. Namely, by means of thermal oxidation using the silicon nitride film 62 as an oxidation-resistant mask, in the surface layer portion of the semiconductor substrate 11 exposed through the openings of the silicon nitride film 62, LOCOS oxide films 21 and 41 are formed.

Thereafter, as shown in FIG. 2E, on the silicon nitride film 62 and the LOCOS oxide films 21 and 41, a resist film 66 having openings 65 corresponding to the trenches 25 are formed. Then, by performing dry etching by using the resist film 66 as a mask, the pad oxide film 61 and the silicon nitride film 62 are selectively removed.

Furthermore, as shown in FIG. 2F, by performing dry etching by using the resist film 66 as a mask, trenches 25 are formed. After forming the trenches 25, the resist film 66 is removed.

Next, as shown in FIG. 2G, by means of thermal oxidation using the silicon nitride film 62 as an oxidation-resistant mask, sacrificial oxide films are temporarily formed on the entire inner surfaces (inner bottom surfaces and inner a side surface) of the trenches 25. After removing the sacrificial oxide films, the thermal oxidation is performed again to form the gate insulating films 26 on the entire inner surfaces of the trenches 25. Due to temporary formation of the sacrificial oxide films, the inner surfaces of the trenches 25 can be smoothened, and the subsequent thermal oxidation forms the gate insulation films 26 with high quality.

Next, as shown in FIG. 2H, on the semiconductor substrate 11, polysilicon 67 doped with an N-type impurity at a high concentration is deposited. Thereby, the insides of the trenches 25 are filled with the polysilicon 67 and the silicon nitride film 62 and the LOCOS oxide films 21 and 41 are covered by the polysilicon 67.

Thereafter, as shown in FIG. 2I, the polysilicon 67 on the silicon nitride film 62 and the LOCOS oxide films 21 and 41 is removed. Namely, the polysilicon 67 remains only inside the trenches 25 and inside the openings of the silicon nitride film 62 communicated with the trenches 25, and polysilicon on the other portions is completely removed.

Next, as shown in FIG. 2J, on the semiconductor substrate 11, a resist film 69 having an opening 68 for exposing the element forming region 43 is formed. Then, by performing etching by using the resist film 69 as a mask, the silicon nitride film 62 on the element forming region 43 is removed. Thereafter, through the opening 68 of the resist film 69, N-type impurity ions (for example, phosphorus ions) for forming the N⁻-type well 51 are implanted. After implantation of the N-type impurity ions, the resist film 69 is removed.

Subsequently, as shown in FIG. 2K, on the semiconductor substrate 11, a resist film 71 having an opening 70 for exposing the element forming region 42 is formed. Then, by performing etching by using the resist film 71 as a mask, the silicon nitride film 62 on the element forming region 42 is removed. Thereafter, P-type impurity ions (for example, boron ions) for forming the P⁻-type well 44 are implanted through the opening 70 of the resist film 71. After implantation of the P-type impurity ions, the resist film 71 is removed.

After removing the resist film 71, annealing is performed for activating the impurity ions implanted into the semiconductor substrate 11. Thereafter, portions of the pad oxide film 61 on the element forming regions 42 and 43 are selectively removed, and by further performing thermal oxidation, as shown in FIG. 2L, on the element forming regions 42 and 43 from which the portions of the pad oxide film 61 were removed, gate insulating films 48 and 55 are respectively formed. On the surface of the polysilicon 67 embedded in the trenches 25 and the openings of the silicon nitride film 62 communicated with the trenches 25, that is, on the surfaces of gate electrode 27, oxide films 72 are formed. Thereafter, on the semiconductor substrate 11, polysilicon 73 which is not doped with an impurity is deposited.

Next, as shown in FIG. 2M, on portions corresponding to the gate electrode 49 and 56 on the polysilicon 73, resist films 74 are formed. Then, by performing etching by using the resist films 74 as a mask, the polysilicon 73 is removed except for the portions covered by the resist films 74. Thereby, on the element forming regions 42 and 43, gate electrode 49 and 56 made of polysilicon which is not doped with an impurity are formed.

Thereafter, as shown in FIG. 2N, the resist film 74 is removed.

Then, as shown in FIG. 2O, on the semiconductor substrate 11, a resist film 76 is formed having an opening 75 for exposing the element forming region 42 is formed. Then, through the opening 75 of the resist film 76, N-type impurity ions for forming the source region 46 and the drain region 47 are implanted into the surface layer portion of the P⁻-type well 44. After implantation of the N-type impurity ions, the resist film 76 is removed.

Next, as shown in FIG. 2P, on the semiconductor substrate 11, a resist film 78 having an opening 77 for exposing the element forming region 43 is formed. Then, through the opening 77 of the resist film 78, P-type impurity ions for forming the source region 53 and the drain region 54 are implanted into the surface layer portion of the N⁻-type well 51. After implantation of the P-type impurity ions, the resist film 78 is removed.

Next, as shown in FIG. 2Q, on the semiconductor substrate 11, a resist film 80 having an opening 79 for exposing the element forming region 22 is formed. Then, by performing etching the silicon nitride film 62 by using the resist film 80 as a mask, the silicon nitride film 62 on the element forming region 22 is removed. Thereafter, through the opening 79 of the resist film 80, P-type impurity ions for forming the P⁻-type region 23 are implanted into the surface layer portion of the element forming region 22. After implantation of the P-type impurity ions, the pad oxide film 61 on the semiconductor substrate 11 and the gate insulating films 26 and the oxide films 72 formed on the surfaces of the portions of the gate electrode 27 projecting from the semiconductor substrate 11 are removed.

Thereafter, on the semiconductor substrate 11, a silicon nitride film is deposited to a thickness which embeds the gate electrode 27, 49, and 56 by means of a CVD method. Then, the silicon nitride film is dry-etched. Thereby, as shown in FIG. 2R, the silicon nitride film remains in a generally triangular shape in a sectional view on a side surface of the gate electrode 27, 49, and 56, and these respectively become a side wall 29, 50, and 57.

Then, as shown in FIG. 2S, on the semiconductor substrate 11, a resist film 82 having openings 86 and 81 for respectively exposing the element forming regions 22 and 42 is formed. By using this resist film 82 as a mask, second implantation of N-type impurity ions for forming the N$^+$-type region 24, the source region 46, and the drain region 47 is performed. At this time, N-type impurity ions are implanted into the gate electrode 49 and the conductivity type of the gate electrode 49 becomes the N$^+$-type. After implanting the N-type impurity ions, the resist film 82 is removed.

Next, as shown in FIG. 2T, on the semiconductor substrate 11, a resist film 84 having an opening 83 for exposing the element forming region 43 is formed. Then, by using this resist film 84 as a mask, second implantation of P-type impurity ions for forming the source region 53 and the drain region 54 is performed. At this time, P-type impurity ions are implanted into the gate electrode 56 and the conductivity type of the gate electrode 56 becomes the P$^+$-type. After implanting the P-type impurity ions, the resist film 84 is removed.

Next, after annealing for activating the impurity ions is performed, cleaning using fluorinated acid is performed to remove unnecessary thin films such as the pad oxide films 61 remaining on the element forming regions 42 and 43. Then, as shown in FIG. 2U, by a sputtering method, a metal film (for example, titanium film, cobalt film, or nickel film) 85 is formed on the semiconductor substrate 11.

Subsequently, heat treatment is performed. Due to this heat treatment, for example, in the case where a titanium film is formed on the semiconductor substrate 11, at an interface between this titanium film and the surface of the semiconductor substrate 11 and the surfaces of the gate electrode 27, 49, and 56, Ti$_2$Si is formed. Thereafter, onto the surface of the semiconductor substrate 11, a sulfuric-peroxide mixture (a mixed solution of sulfuric acid and hydrogen peroxide solution) is supplied, and the metal film 85 that has not reacted to silicon is removed from the semiconductor substrate 11. Thereby, only at the interface between the metal film 85 and the surface of the semiconductor substrate 11 and the surfaces of the gate electrode 27, 49, and 56, only the metal film 85 that has reacted to silicon remains. Then, the second heat treatment is performed, and by this heat treatment, the metal silicide films 30, 31, and 58 are formed. For example, when a titanium film is formed on the semiconductor substrate 11, Ti$_2$Si on the surface of the semiconductor substrate 11 and the surfaces of the gate electrode 27, 49, and 56 changes into TiSi$_2$, and on these surfaces, a titanium silicide film is formed. Thereby, the semiconductor device with the structure shown in FIG. 1 is obtained.

As described above, on the side surface of the gate electrode 27 of the VDMOSFET 12, the side wall 29 is formed, so that after forming the side wall 50 and 57 on the respective a side surface of the gate electrode 49 and 56, the step of removing the silicon nitride film remaining on the side surface of the gate electrode 27 can be omitted. In the construction in which the metal silicide films 31 and 58 are present on the semiconductor substrate 11 and the gate electrode 49 and 56 of the NMOSFET 14 and the PMOSFET 15, the lithography process, etc., for selectively forming the metal silicide film 30 only on the gate electrode 27 can be made unnecessary. Therefore, the manufacturing process for a semiconductor device in which the VDMOSFET 12, the NMOSFET 14, and the PMOSFET 15 are provided in a mixed manner can be simplified.

Figure 3:
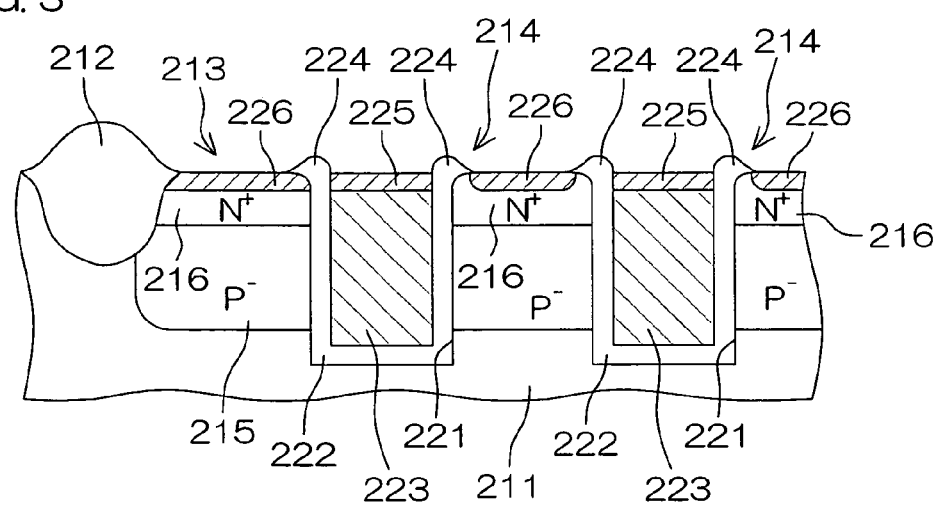
FIG. 3 is a schematic sectional view showing a structure of a semiconductor device according to a second embodiment of the present invention.

FIG. 3 is a schematic sectional view showing a structure of a semiconductor device according to an embodiment of the present invention. This semiconductor device has an element forming region 213 separated by the LOCOS oxide film 212 on the N$^-$-type semiconductor substrate 211.

In the element forming region 213, a plurality of VDMOSFETs 214 are formed. Specifically, in the element forming region 213, in the surface layer portion of the semiconductor substrate 211, a P$^-$-type region 215 is formed. In the surface layer portion of this P$^-$-type region 215, N$^+$-type region 216 and P$^+$-type region that is not shown are formed. Furthermore, in the element forming region 213, a plurality of trenches 221 are formed. Each trench 221 penetrates the N$^+$-type region 216 and the P$^-$-type region 215, and the deepest portion of each trench 221 reaches the semiconductor substrate 211. In this embodiment, the plurality of trenches 221 are formed in stripes extending toward the P$^+$-type region substantially parallel to each other.

Inside the trench 221, a gate electrode 223 made of polysilicon doped with an impurity at a high concentration is embedded via a gate insulating film (oxide film) 222. The gate insulating film 222 has, on its upper end portion, a bird's beak 224 which protrudes from the surface of the semiconductor substrate 211. The surface of the gate electrode 223 is formed lower than the surface of the bird's beak 224.

On the gate electrode 223, a metal silicide film 225 is formed so as to fill the inside of the trench 221. Thereby, the gate electrode wiring formed by the gate electrode 223 and the metal silicide film 225 is lowered in resistance. By lowering the resistance of the gate electrode wiring, an increase in parasitic resistance according to an increase in fineness of the gate electrode wiring can be suppressed.

On the N$^+$-type region 216 and the unillustrated P$^+$-type region, a metal silicide film 226 is formed. On the metal silicide film 226, a source electrode is formed via an interlayer insulation film although this is not shown. By forming the metal silicide film 226, the N$^+$-type region 216 and the P$^+$-type region are electrically conducted to each other, and can be kept at the same potential. Therefore, by forming a contact hole in the interlayer insulation film in the P$^+$-type region and connecting the source electrode to the P$^+$-type region via the contact hole, electrical connection between the source electrode and the N$^+$-type region 216 can be realized without providing a contact with the source electrode on the N$^+$-type region 216. As a result, the distance between trenches 221 is shortened and the fineness of the VDMOSFETs 214 can be increased.

Furthermore, on the upper end of the gate insulating film 222, the bird's beak 224 protruding from the surface of the semiconductor substrate 211 is formed, so that the metal silicide film 225 on the gate electrode 223 and the metal silicide film 226 on the semiconductor substrate 211 can be formed in a self-aligning manner. Therefore, when forming the metal silicide films 225 and 226, the lithography process, etc., can be made unnecessary. As a result, the manufacturing process for the semiconductor device including the VDMOSFETs 214 can be simplified.

FIG. 4A through FIG. 4H are schematic sectional views showing a method for manufacturing the semiconductor device in order of steps.

Figure 4A:
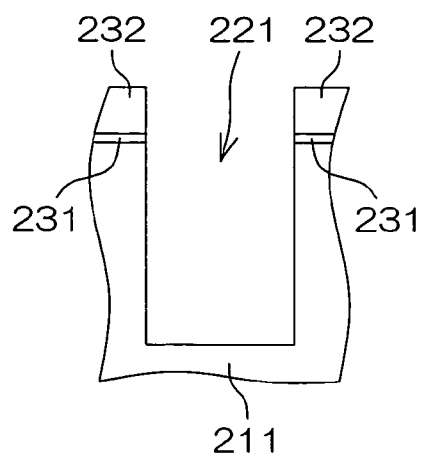
FIG. 4A is a schematic sectional view for describing a method for manufacturing the semiconductor device shown in FIG. 3.

First, as shown in FIG. 4A, an oxide film 231 is formed on a semiconductor substrate 211. Next, on the oxide film 231, a silicon nitride film 232 is formed. Then, on the silicon nitride film 232, a resist film having an opening corresponding to the trench 221 is formed. Thereafter, the trench 221 is formed by dry etching using this resist film as a mask. After forming the trench 221, the resist film is removed.

Figure 4B:
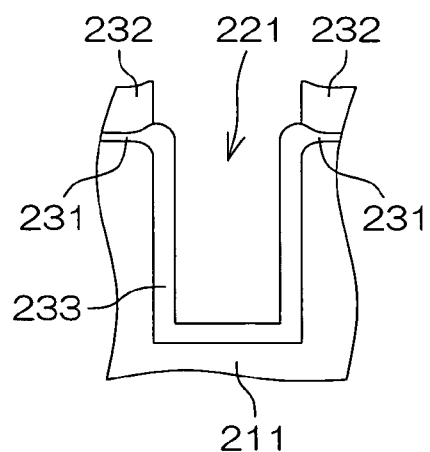
FIG. 4B is a schematic sectional view showing a next step from FIG. 4A.

Next, as shown in FIG. 4B, by performing thermal oxidation by using the silicon nitride film 232 as an oxidation-resistant mask, a sacrificial oxide film 233 is formed on the entire inner surface (inner bottom surface and inner side surface) of the trench 221. In this thermal oxidation for forming the sacrificial oxide film 233, along with formation of the sacrificial oxide film 233, the connected portion between the sacrificial oxide film 233 and the oxide film 231 grows, and this portion protrudes so as to push up the silicon nitride film 232.

Figure 4C:
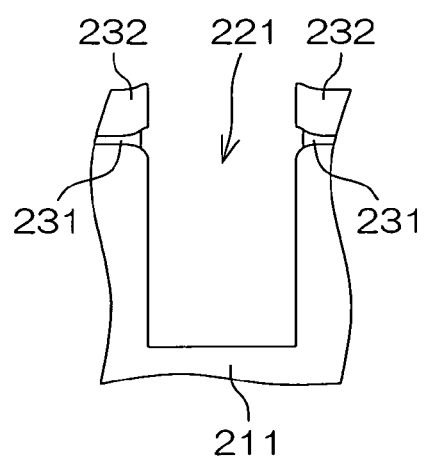
FIG. 4C is a schematic sectional view showing a next step from FIG. 4B.

Next, as shown in FIG. 4C, the sacrificial film 233 in the trench 221 is removed. Thereby, the inner surface of the trench 221 becomes smooth, and the gate insulating film 222 can be formed with high quality in the trench 221. Even after removing the sacrificial oxide film 233, at the peripheral edge of the trench 221, the portion where the thick oxide film 231 is formed remains.

Figure 4D:
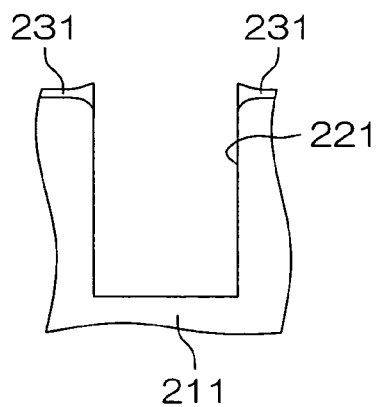
FIG. 4D is a schematic sectional view showing a next step from FIG. 4C.

Thereafter, as shown in FIG. 4D, the silicon nitride film 232 on the oxide film 231 is removed.

Figure 4E:
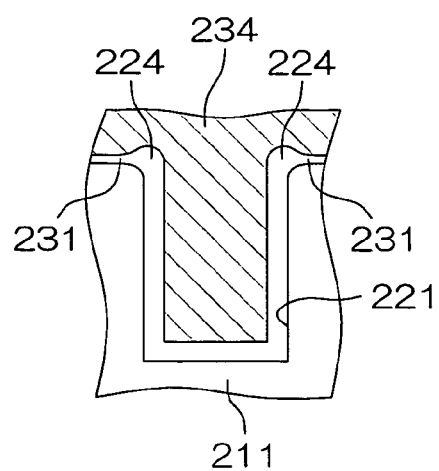
FIG. 4E is a schematic sectional view showing a next step from FIG. 4D.

Then, as shown in FIG. 4E, thermal oxidation is performed again to form an oxide film on the entire inner surface of the trench 221. In this thermal oxidation, the oxide film 231 and the oxide film in the trench 221 are connected to each other. At this connected portion, further oxide growth occurs to form the bird's beak 224.

Figure 4F:
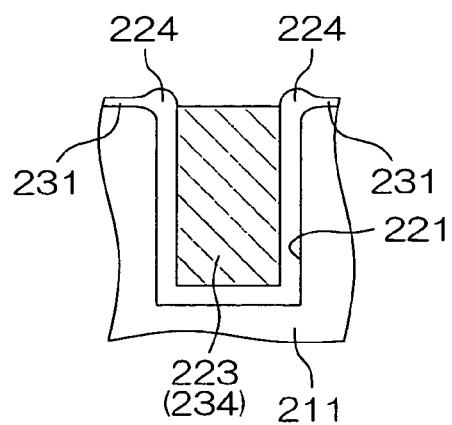
FIG. 4F is a schematic sectional view showing a next step from FIG. 4E.

Next, on the semiconductor substrate 211, polysilicon 234 doped with an impurity at a high concentration is deposited. Thereby, the inside of the trench 221 is filled up with the polysilicon 234, and the oxide film 231 is further covered by the polysilicon 234. Thereafter, as shown in FIG. 4F, the polysilicon 234 outside the trench 221 is removed by dry etching, and furthermore, the polysilicon 234 inside the trench 221 is also removed so as to become lower than the surface of the bird's beak 224. Thereby, the gate electrode 223 is formed inside the trench 221.

Figure 4G:
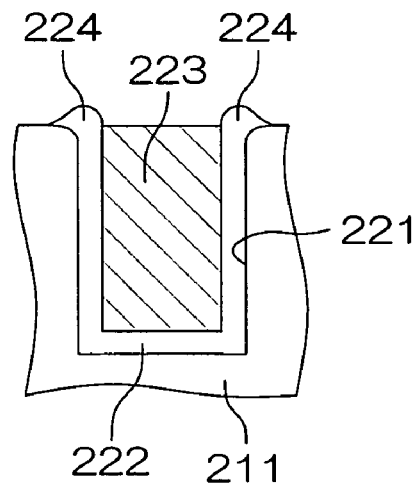
FIG. 4G is a schematic sectional view showing a next step from FIG. 4F.

Next, as shown in FIG. 4G, the oxide film 231 outside the trench 221 is removed, and the gate insulating film 222 having the bird's beak 224 is formed.

Figure 4H:
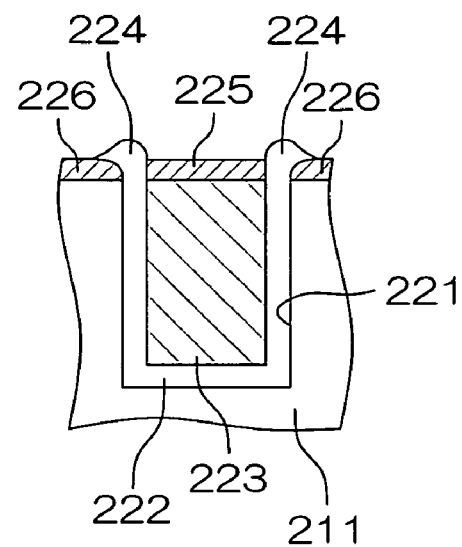
FIG. 4H is a schematic sectional view showing a next step from FIG. 4G.
Figure 5:
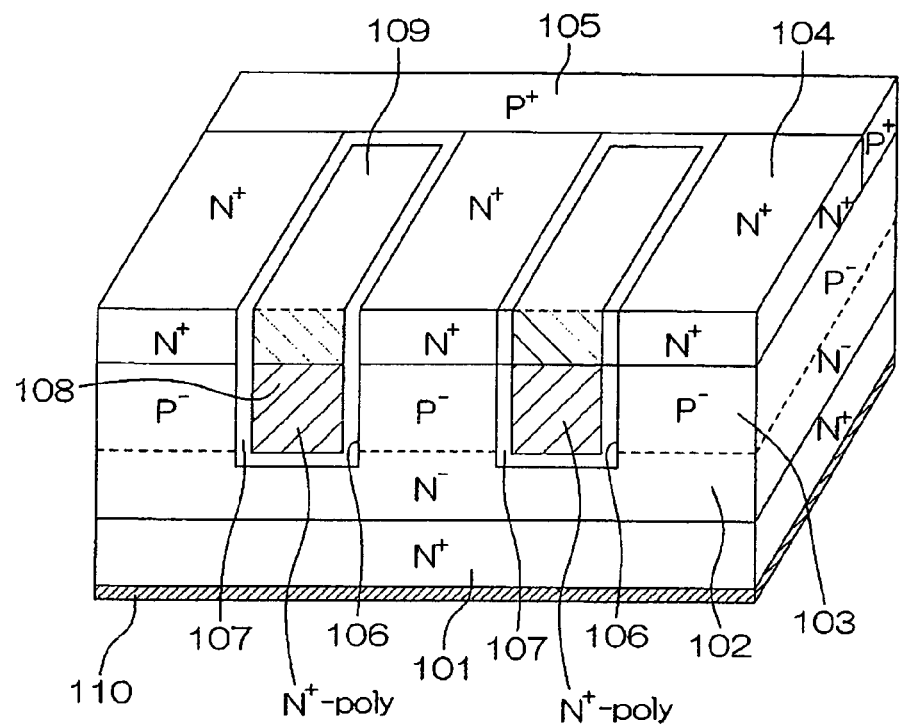
FIG. 5 is a perspective view schematically showing a vertical double diffused MOSFET in which a conventional trench gate structure is employed.

Thereafter, as shown in FIG. 4H, by a sputtering method, a metal film (for example, a titanium film, a cobalt film, or a nickel film) is formed on the semiconductor substrate 211.

Subsequently, heat treatment is performed. By this heat treatment, for example, in the case where a titanium film is formed on the semiconductor substrate 211, $Ti_2Si$ is formed at the interface between this titanium film and the surface of the semiconductor substrate 211 and the surface of the gate electrode 223. Thereafter, onto the surface of the semiconductor substrate 211, a sulfuric-peroxide mixture (a mixed solution of sulfuric acid and hydrogen peroxide solution) is supplied to remove the metal film which has not reacted to silicon from the semiconductor substrate 211. Thereby, only at the interface between the metal film and the surface of the semiconductor substrate 211 and the surface of the gate electrode 223, only the metal film which has reacted to silicon remains. Then, the second heat treatment is performed, and by this heat treatment, the metal silicide films 225 and 226 are formed. For example, when a titanium film is formed on the semiconductor substrate 211, $Ti_2Si$ on the surface of the semiconductor substrate 211 and the surface of the gate electrode 223 is layer-rearranged into $TiSi_2$, and on these surfaces, titanium silicide films are formed. Thereby, the semiconductor device with the structure shown in FIG. 3 is obtained.

In this embodiment, after the sacrificial oxide film 233 is removed and the silicon nitride film 232 on the oxide film 231 is removed, by performing thermal oxidation, an oxide film which becomes the gate insulating film 222 is formed on the inner surface of the trench 221. However, it is also possible that the oxide film that becomes the gate insulating film 222 is formed on the inner surface of the trench 221 by performing thermal oxidation after the sacrificial oxide film 233 is removed, and thereafter, the silicon nitride film 232 on the oxide film 231 is removed.

The embodiments of the present invention have been described in detail above, and these are only detailed examples used for making apparent the technical contents of the present invention, and the present invention should not be interpreted limitedly to these detailed examples, and the spirit and scope of the present invention are limited only by the accompanying claims.

The present application corresponds to Japanese Patent Application Nos. 2005-344201 and 2005-344202 filed on Nov. 29, 2005 in the Japanese Patent Office, and whole disclosures of these applications are incorporated herein by citation.

What is claimed is:

1. A semiconductor device including:
    a vertical double diffused MOS transistor with a trench gate structure, further comprising:
    a semiconductor substrate;
    a plurality of trenches formed on the semiconductor substrate in a stripe shape;
    a gate electrode disposed within at least one of said plurality of trenches and projecting from a surface of the semiconductor substrate;
    a side wall formed on a side surface of the gate electrode;
    a first metal silicide film formed on a surface of the gate electrode;
    a second metal silicide film formed on the surface of the semiconductor substrate; and
    a source electrode, wherein
    the semiconductor substrate has a source region formed between the plurality of trenches and an adjacent region adjacent to the source region,
    the plurality of trenches extend to the adjacent region, and
    the second metal silicide film is formed on the source region and the adjacent region, and is electrically connected to the source region and the adjacent region,
    wherein the source electrode is electrically connected to the source region via a contact provided on the adjacent region and the second metal silicide film.

2. A semiconductor device according to claim 1, wherein a P-type region is formed on a surface layer portion of the semiconductor substrate of N-type, the source region of N-type and the adjacent region of P-type are formed on a surface layer portion of the P-type region, the trench penetrates the source region and the P-type region, and a deepest portion reaches the semiconductor substrate.

3. A semiconductor device according to claim 1, further comprising an interlayer insulating film formed on the second metal silicide film, wherein
    a contact hole is formed in the interlayer insulating film on the adjacent region, and the source electrode is connected to the second metal silicide film via the contact hole.

4. A semiconductor device including:
    a planar MOS transistor and a vertical double diffused MOS transistor with a trench gate structure, comprising:
    a semiconductor substrate having a first region formed with the vertical double diffused MOS transistor and a second region formed with the planar MOS transistor;
    a plurality of trenches formed on the first region of the semiconductor substrate in a stripe shape;

a vertical double diffused MOS transistor gate electrode disposed within at least one of the plurality of trenches and projecting from a surface of the semiconductor substrate;

a planar MOS transistor gate electrode formed on the second region of the semiconductor substrate;

a side wall formed on a side surface of the vertical double diffused MOS transistor gate electrode and the planar MOS transistor gate electrode;

a first metal silicide film formed on a surface of the vertical double diffused MOS transistor gate electrode;

a second metal silicide film formed at the first region on the surface of the semiconductor substrate;

a third metal silicide film formed on a surface of the planar MOS transistor gate electrode;

a fourth metal silicide film formed at the second region on the surface of the semiconductor substrate; and a source electrode of the vertical double diffused MOS transistor, wherein the semiconductor substrate has a source region formed at the first region between the plurality of trenches and an adjacent region adjacent to the source region, the plurality of trenches extend to the adjacent region, and the second metal silicide film is formed on the source region and the adjacent region, and is electrically connected to the source region and the adjacent region, wherein the source electrode is electrically connected to the source region via a contact provided on the adjacent region and the second metal silicide film.

5. A semiconductor device including:

a vertical double diffused MOS transistor with a trench gate structure, further comprising:

a semiconductor substrate;

a plurality of trenches formed on the semiconductor substrate in a stripe shape;

a gate insulating film formed along an inner surface of at least one of the plurality of trenches and having a ridged portion ridging to an outside of the said trench;

a gate electrode embedded within the at least one of the plurality of trenches;

a first metal silicide film formed on a surface of the gate electrode;

a second metal silicide film formed on the surface of the semiconductor substrate; and a source electrode, wherein the semiconductor substrate has a source region formed between the plurality of trenches and an adjacent region adjacent to the source region, the plurality of trenches extend to the adjacent region, and the second metal silicide film is formed on the source region and the adjacent region, and is electrically connected to the source region and the adjacent region, wherein a contact to the source electrode is provided on the adjacent region, and the source electrode is electrically connected to the source region via the contact provided on the adjacent region and the second metal silicide film.

6. A semiconductor device according to claim 5, wherein the source electrode is electrically connected to the source region via the second metal silicide film.

7. A semiconductor device according to claim 5, wherein the ridged portion of the gate insulating film ridges higher than both of the first metal silicide film and the second metal silicide film.

8. A semiconductor device according to claim 5, wherein a P-type region is formed on a surface layer portion of the semiconductor substrate of N-type, the source region of N-type and the adjacent region of P-type are formed on a surface layer portion of the P-type region, the trench penetrates the source region and the P-type region, and a deepest portion reaches the semiconductor substrate.

9. A semiconductor device according to claim 5, further comprising an interlayer insulating film formed on the second metal silicide film, wherein a contact hole is formed in the interlayer insulating film on the adjacent region, and the source electrode is connected to the second metal silicide film via the contact hole.

* * * * *